(12) United States Patent
Gardner et al.

(10) Patent No.: US 6,175,144 B1
(45) Date of Patent: *Jan. 16, 2001

(54) ADVANCED ISOLATION STRUCTURE FOR HIGH DENSITY SEMICONDUCTOR DEVICES

(75) Inventors: Mark I. Gardner, Cedar Creek; Mark C. Gilmer, Austin, both of TX (US)

(73) Assignee: Advanced Micro Devices, Inc., Austin, TX (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/163,795

(22) Filed: Sep. 30, 1998

Related U.S. Application Data

(62) Division of application No. 09/079,759, filed on May 15, 1998.

(51) Int. Cl.⁷ .................................................. H01L 29/00
(52) U.S. Cl. ......................... 257/506; 257/510; 257/513
(58) Field of Search .................................. 257/506, 510, 257/513; 438/424, 426, 427, 430, 431, 432, 433

(56) References Cited

U.S. PATENT DOCUMENTS

| | | | |
|---|---|---|---|
| 4,472,240 | * 9/1984 | Kameyama | 257/510 |
| 4,495,025 | * 1/1985 | Haskell | 257/513 |
| 4,579,812 | * 4/1986 | Bower | 438/427 |
| 5,130,268 | 7/1992 | Liou et al. | 437/67 |
| 5,411,913 | * 5/1995 | Bashir et al. | 438/432 |
| 5,536,675 | * 7/1996 | Bohr | 438/427 |
| 5,646,063 | 7/1997 | Mehta et al. | 437/67 |
| 5,731,221 | 3/1998 | Kwon | 437/67 |
| 5,763,315 | * 6/1998 | Benedict et al. | 438/424 |
| 5,843,226 | 12/1998 | Zhao et al. | 117/97 |
| 5,904,540 | * 5/1999 | Sheng et al. | 438/427 |

FOREIGN PATENT DOCUMENTS 9-321134A * 12/1997 (JP) ................................ H01L/21/76

* cited by examiner

Primary Examiner—Sara Crane
(74) Attorney, Agent, or Firm—Williams, Morgan & Amerson

(57) ABSTRACT

The present invention is directed to a semiconductor device having an improved structure for isolating transistors formed on a semiconductor substrate, and a method for making same. The device is comprised of a semiconductor device having first and second recesses formed in the substrate of the device. The inventive method disclosed herein comprises forming first and second recesses in the substrate of the device. The first width of the first recess is formed such that it is greater than the second width of the second recess, and the second depth of the second recess is formed such that it is greater than the first depth of the first recess.

19 Claims, 3 Drawing Sheets

ADVANCED ISOLATION STRUCTURE FOR HIGH DENSITY SEMICONDUCTOR DEVICES

This is a continuing prosecution application (CPA) of application Ser. No. 09/163,795, filed Sep. 30, 1998, which is a divisional of co-pending application Ser. No. 09/079,759, filed May 15, 1998, now abandoned.

BACKGROUND OF THE INVENTION

1. Field of the Description

This invention generally relates to semiconductor processing, and, more particularly, to the isolation of transistors formed on a substrate.

2. Description of the Related Art

The implementation of electrical circuits requires connecting isolated devices through very specific electrical paths. As it relates to the fabrication of various integrated circuits on, for example, a silicon substrate, this means that the various devices formed in the silicon must be electrically isolated from one another. Such devices, when properly isolated, may thereafter be interconnected to create specific electrical circuits.

The ability to effectively isolate electrical devices, such as transistors, from one another is very important in the fabrication of integrated circuits. For example, effective isolation of electrical field effect transistors is highly desirable to prevent the establishment of unwanted parasitic channels between adjacent devices. Yet another example is the requirement for effective isolation of the collector regions of bipolar integrated circuits.

Generally speaking, the deeper an isolation structure extends into the surface of the substrate, the better the performance of the isolation structure. However, problems have been encountered as the depth of single width trenches has been increased. For example, with deep, single width trenches, problems have arisen at the intersection of the trench with the surface of the substrate. The problems have included, but are not limited to, lack of adhesion of process layers on the surface of the substrate, cracks in the substrate and/or the process layers, and delamination of process layers, etc.

The present invention is directed to a method and device that solves some or all of the aforementioned problems.

SUMMARY OF THE INVENTION

The present invention is directed to a semiconductor device having an improved structure for isolating transistors formed on a semiconductor substrate, and a method for making same. The device is comprised of a semiconductor device having a first recess formed in the substrate of the device. The first recess has a first width and extends a first depth beneath the surface of the substrate. The device further comprises a second recess formed in the substrate of the device. The second recess has a second width and extends a second depth beneath the surface of the substrate. The second depth of the second recess is greater than the first depth of the first recess, and the first width of the first recess is greater than the second width of the second recess. The device further comprises an isolation structure positioned in at least a portion of the first and second recesses.

The inventive method disclosed herein comprises forming a first recess in the substrate of the device, said first recess having a first depth and a first width, and forming a second recess in the substrate of the device, the second recess having a second depth and a second width. The first width of the first recess is formed such that it is greater than the second width of the second recess, and the second depth of the second recess is formed such that it is greater than the first depth of the first recess. The method further includes formation of an isolation structure in the first and second recesses.

BRIEF DESCRIPTION OF THE DRAWINGS

The invention may be understood by reference to the following description taken in conjunction with the accompanying drawings, in which like reference numerals identify like elements, and in which.

Figure 1:
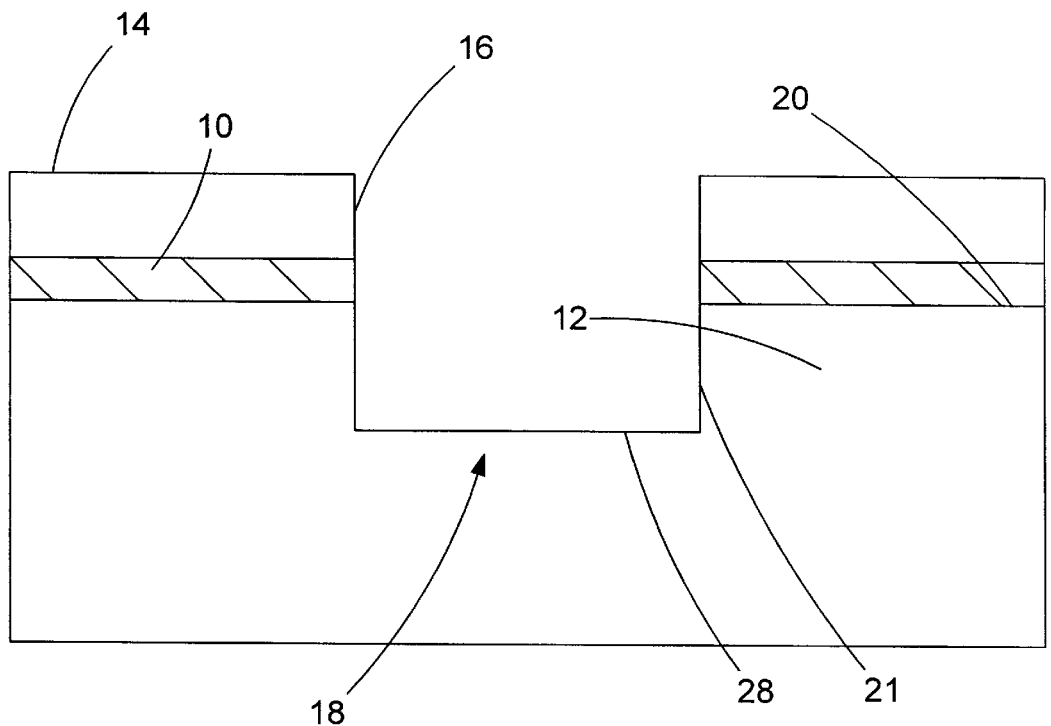
FIG. 1 is a cross-sectional view showing formation of an initial trench of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The invention disclosed herein will now be described with reference to FIGS. 1–5. As shown in FIG. 1, a masking layer 10 is formed on a substrate 12. A layer of photoresist 14 is formed on the masking layer 10. The photoresist layer 14 is patterned to define an opening 16. Thereafter, the portion of the masking layer 10 within the opening 16 is removed and an initial trench 18 is formed in the substrate 12. The initial trench 18 has a bottom 28 and sidewalls 21. The sidewalls 21 of the initial trench 18 may be formed at an angle ranging between 80–90° relative to the surface 20 of the substrate 12.

The masking layer 10 may be formed from a variety of materials, including, but not limited to, oxide, nitride, oxynitride, etc. As readily recognized by those skilled in the art, the masking layer 10 may be formed by a variety of techniques, including, but not limited to, deposition, thermal growing, sputtering, etc. In one embodiment, the masking layer 10 is oxynitride, which may range between 50–100 Å in thickness. The substrate 12 may be made of any semiconductor material, and, in one embodiment, the substrate 12 is doped silicon.

The masking layer 10 may be removed at the same time that the initial trench 18 is formed in the substrate 12. Alternatively, the masking layer 10 may be removed in a separate process step, for example, a wet etch step, prior to the formation of the initial trench 18. In one embodiment, the masking layer 10 is removed and the initial trench 18 is formed during a single process step. For example, the masking layer 10 may be removed and the initial trench 18 may be formed by a plasma etch or reactive ion etch process using, for example, HBr and $Cl_2$ as the etchant gases. Those skilled in the art will recognize that the particular etch chemistry used will depend upon design conditions. In one embodiment, the initial trench 18 may be approximately 2000–3000 Å wide and may extend beneath the surface 20 of the substrate 12 by approximately 500–1000 Å.

Figure 2:
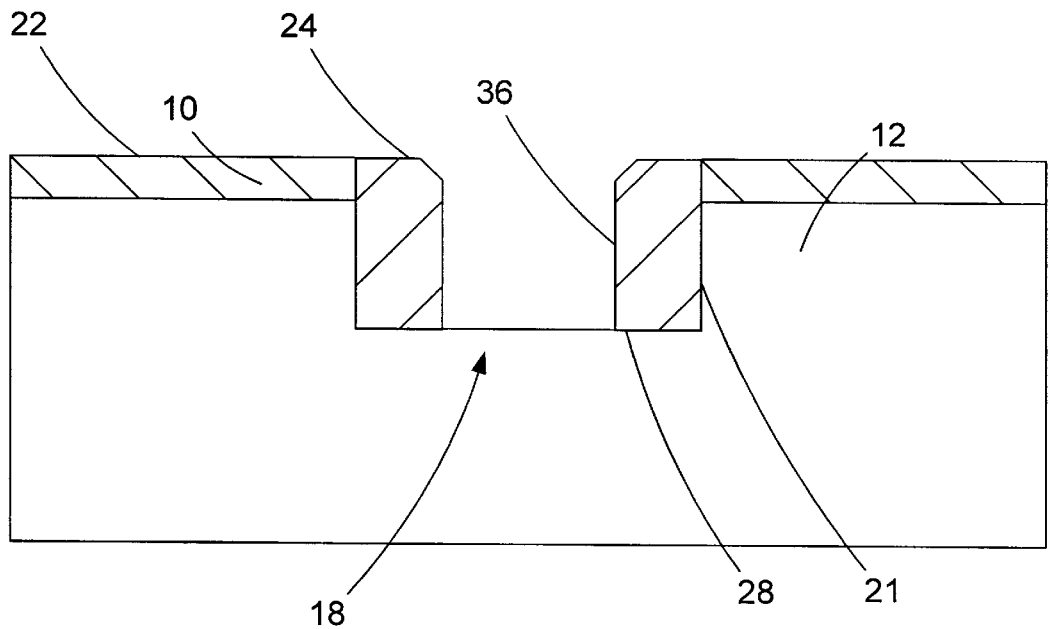
FIG. 2 is a cross-sectional view showing formation of a plurality of spacers in the initial trench of the present invention.

As shown in FIG. 2, the photoresist layer 14 is removed. A spacer material is then deposited into the initial trench 18 and onto at least a portion of the surface 22 of the masking layer 10. Thereafter, an anisotropic etch is performed that results in the formation of spacers 24 as shown in FIG. 2. By way of example only, the spacers 24 may be formed by a plasma etch process using $ArCHF_3$ and $ArCF_4$ as the etchant gases. Of course, other etch chemistries may be used.

The spacers 24 may be made from a variety of materials, such as oxide, oxynitride, nitride, etc. In one embodiment, the spacers 24 may be made of oxide and may have a thickness ranging between approximately 300–1000 Å. It is desirable that the spacers 24 be made of a material other than the material used to make the masking layer 10, to allow for subsequent selective removal of the masking layer 10 without removing the spacers 24 (as discussed more fully below).

Figure 3:
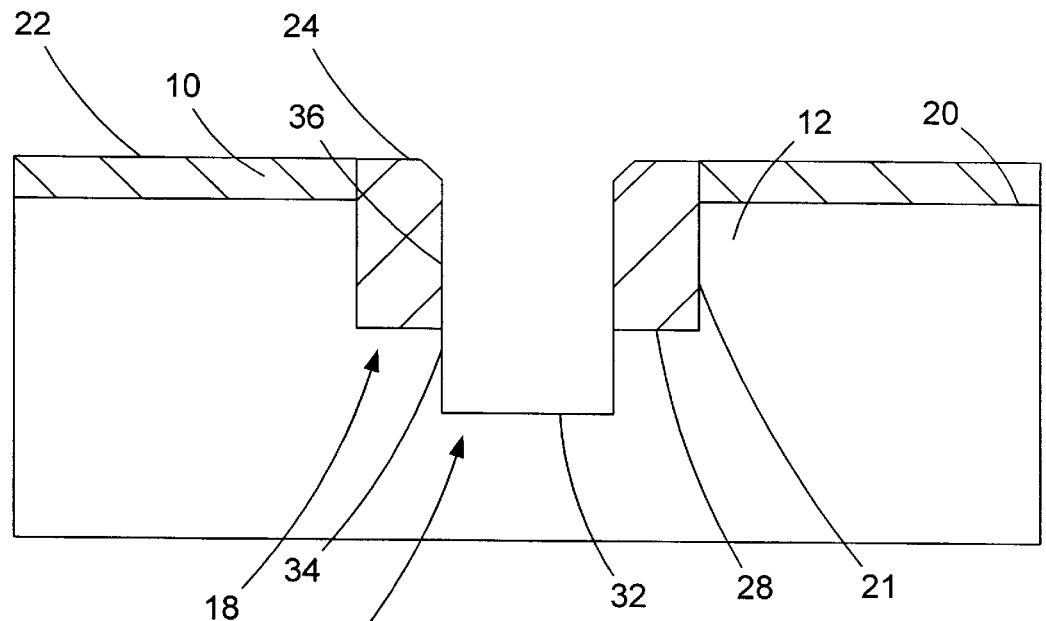
FIG. 3 is a cross-sectional view showing formation of a second trench of the present invention.

With reference to FIG. 3, the next process involves forming a second trench 26 having a bottom 32 and sidewalls 34 in the substrate 12. The sidewalls 34 of the second trench 26 may be formed at an angle ranging between 80–90° relative to the surface 20 of the substrate 12. The second trench 26 may be formed using the same processes (discussed above) used to form the initial trench 18, e.g., plasma etching or reactive ion etching. In one embodiment, the second trench 26 may have a width ranging between approximately 1000–2400 Å and may extend approximately 1000–3000 Å below the bottom 28 of the initial trench 18. Stated in the alternative, the second trench 26 would extend approximately 1500–4000 Å beneath the surface 20 of the substrate 12.

Figure 4:
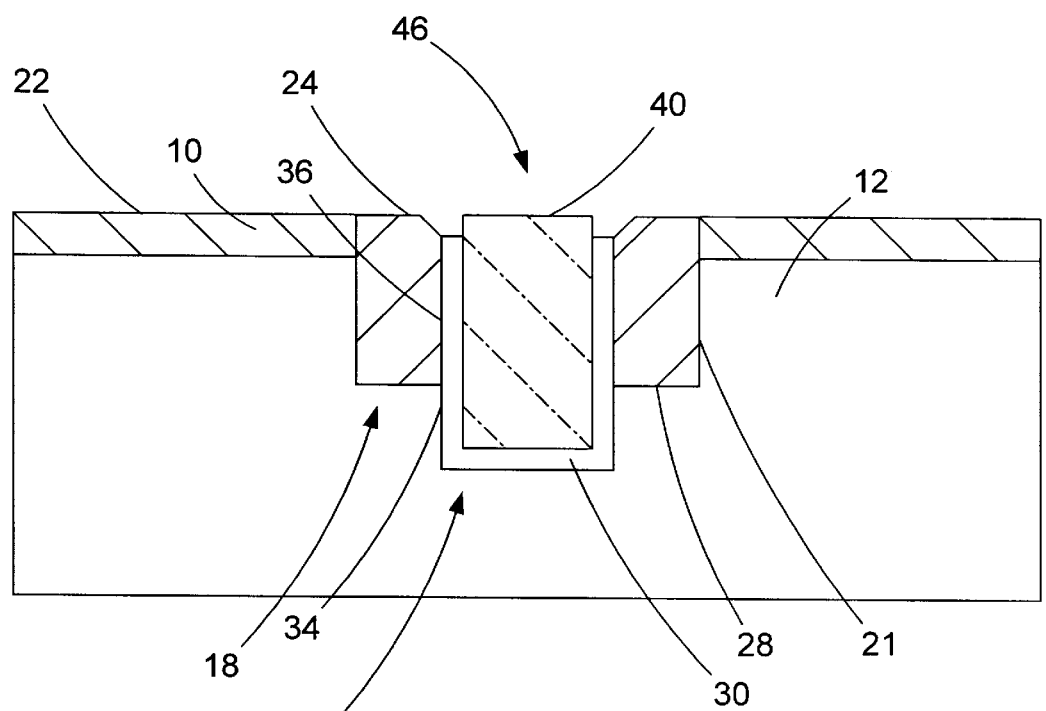
FIG. 4 is a cross-sectional view showing formation of an isolation material in the second trench of the present invention.

As shown in FIG. 4, the next process involves forming an isolation liner 30 in the second trench 26. The isolation liner 30 may extend across the bottom 32 and sides 34 of the second trench 26 formed in the substrate 12, as well as along the sidewalls 36 of the spacers 24. Thereafter, an isolation material 40 may be formed in the area defined by the second trench 26 and the sidewalls 36 of the spacers 24. In one embodiment, the isolation liner 30 is positioned between the spacers 24 and the isolation material 40. Of course, the isolation liner 30 may be omitted or only deposited on portions of the surfaces depicted in FIG. 4.

As is apparent to those skilled in the art, the material or materials selected to be deposited in the combined area defined by the initial trench 18 and the second trench 26 may be considered to be an isolation structure 46. The particular material or materials used to form the isolation structure 46 will vary depending upon design requirements. For example, the isolation structure 46 could be comprised of a single material that would fill the entire region defined by the initial trench 18 and the second trench 26. Alternatively, the isolation structure 46 may be comprised of multiple materials positioned within the initial trench 18 or second trench 26, or portions thereof, as dictated by design or manufacturing considerations.

Figure 5:
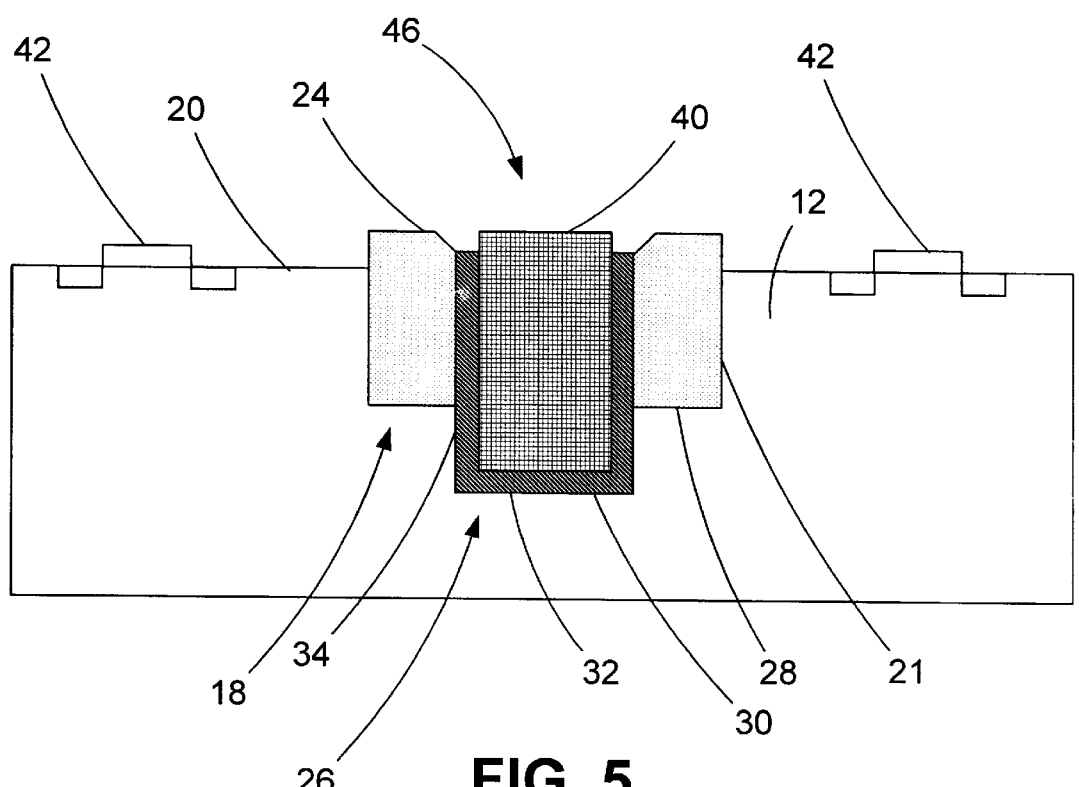
FIG. 5 is a cross-sectional view showing an advanced isolation region of the present invention.

One illustrative embodiment of an isolation structure 46 is shown in FIGS. 4 and 5. As depicted therein, the isolation structure 46 may be comprised of the spacers 24, isolation liner 30 and isolation material 40. However, the illustrative embodiment of an isolation structure 46 shown in FIG. 5 should not be construed as a limitation of the present invention. To the contrary, those skilled in the art will readily recognize that the materials selected for the isolation structure 46 and the particular configuration of those materials with the initial trench 18 and the second trench 26 are purely a matter of design choice.

The isolation liner 30 may be formed from a variety of materials, including, but not limited to, oxide, oxynitride, nitride, tetraethyl orthosilicate ("TEOS"), etc. In one embodiment, the isolation liner 30 may be made of TEOS and may be approximately 50–150 Å thick. As will be readily recognized by those skilled in the art, the isolation liner 30 may be formed by a variety of techniques, including, but not limited to, chemical vapor deposition and sputtering.

The isolation material 40 may be comprised of any of a variety of materials having a low dielectric constant ("k"), such as fluorosilicate glass, silicon oxyfluoride, hydrogen silsesquixane, fluorinated polysilicon, polyphenylquinoxaline, polyquinoline (k=3.0), methylsilisesquixane polymer, and fluoro-polymide. The isolation material 40 may have a dielectric constant ranging between 2.5–3.5. The isolation material 40 may be formed by a variety of techniques, including, but not limited to, deposition, sputtering and spinning the material on the substrate. In one embodiment, the isolation material 40 may be polyquinoline, with a "k" value of approximately 3.0, that is formed by spinning the material on the substrate.

After the isolation liner 30 and the isolation material 40 are formed, the wafer is polished, for example, by a chemical mechanical polishing process, to remove any excess material used to form the isolation liner 30 and isolation material 40, and to planarize the isolation material 40, isolation liner 30 and spacers 24 with the surface 22 of the masking layer 10. Thereafter, as shown in FIG. 5, the masking layer 10 may be removed and transistors 42 and 44 (shown schematically) may be formed using traditional techniques.

The advanced isolation structure and technique disclosed herein provides effective isolation of semiconductor devices formed on a substrate. In particular, the formation of an isolation structure involving a dual depth, dual width trench reduces or eliminates some of the problems traditionally encountered at the intersection of a deep, single width trench and the surface of the substrate. This is accomplished by the formation of an initial trench 18 to a depth that is shallower than the depth of traditional deep, single width trenches. Additionally, the configuration of the dual depth, dual width trench disclosed herein may allow for the formation of more effective isolation structures 46. For example, and by way of illustration only, an isolation material 40 having a low "k" value may be used as part of the overall isolation structure 46. This isolation material 40 may be isolated from the substrate 12 by, for example, a liner 30. This liner 30 acts to prevent the low "k" isolation material 40 from contaminating the substrate 12. In one embodiment, the spacers 24 act to insulate the isolation material 40 from parts of adjacent semiconductor devices, such as source and drain regions. However, as discussed above, the particular isolation structure 46 depicted in the drawings is illustrative only, and does not represent the only isolation structure 46 that can be made using the disclosed trench configurations and technologies.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a substrate, said substrate having a surface;
   a first recess and a second recess formed in said substrate, said flat recess having a first width and extending a first depth of at most about 1000 Å beneath the surface of said substrate, said second recess having a second width and extending a second depth beneath the surface of said substrate;
   said first width of said first recess being greater than said second width of said second recess;
   said second depth of said second recess being greater than said first depth of said first recess; and
   an isolation structure positioned in at least a portion of said first and second recesses.

2. The device of claim 1, wherein said isolation structure is comprised of a single isolation material.

3. The device of claim 1, wherein said isolation structure is comprised of a plurality of spacers formed in said first recess.

4. The device of claim 1, wherein said isolation structure is comprised of an isolation liner positioned in at least a portion of at least one of said first and second recesses.

5. The device of claim 1, wherein said isolation structure is comprised of:
   a plurality of spacers positioned in said first recess;
   an isolation liner positioned, in at least a portion of said second recess; and
   an isolation material positioned between said spacers and in said second recess adjacent said isolation liner.

6. The device of claim 1, wherein said isolation structure comprises:
   a plurality of spacers positioned in said first recess;
   an isolation liner positioned in said second recess and extending between said spacers; and
   an isolation material positioned in said first and second recesses between said isolation liner.

7. The device of claim 1, wherein said isolation structure is comprised of silicon dioxide.

8. The device of claim 1, wherein said isolation structure is comprised of oxynitride.

9. The device of claim 3, wherein said spacers are oxide spacers.

10. The device of claim 3, wherein at least one of said spacers is an oxynitride spacers.

11. The device of claim 4, wherein said isolation liner is comprised of at least one of the group of tetraethyl orthosilicate, oxide, oxynitride or nitride.

12. The device of claim 1, wherein said first depth of said first recess ranges between approximately 500–1000 Å beneath the surface of said substrate.

13. The device of claim 1, wherein said second depth of said second recess extends approximately 1500–4000 Å beneath the surface of said substrate.

14. The device of claim 2, wherein said first width of said first recess ranges between 2000–3000 Å.

15. The device of claim 2, wherein said second width of said second recess ranges between 1000–2400 Å.

16. A semiconductor device, comprising:
   a substrate, said substrate having a surface;
   a first recess and a second recess formed in said substrate, said first recess having a first width and extending a first depth of at most about 1000 Å beneath the surface of said substrate, said second recess having a second width and extending a second depth beneath the surface of said substrate;
   said first width of said first recess being greater than said second width of said second recess;
   said second depth of said second recess being greater than said first depth of said first recess; and
   an isolation material positioned in at least a portion of said first and second recesses.

17. The device of claim 16, further comprising a plurality of spacers positioned in said first recess.

18. The device of claim 16, further comprising an isolation liner positioned in at least a portion of said second recess, at least a portion of said isolation liner positioned between said spacers and said isolation material.

19. A semiconductor device, comprising:
   a substrate, said substrate having a surface;
   a first recess and a second recess formed in said substrate, said first recess having a first width and extending a first depth of at most about 1000 Å beneath the surface of said substrate, said second recess having a second width and extending a second depth beneath the surface of said substrate;
   said first width of said first recess being greater than said second width of said second recess;
   said second depth of said second recess being greater than said first depth of said first recess; and
   an isolation structure, said isolation structure comprising:
   a plurality of spacers positioned in said first recess;
   an isolation liner positioned in said second recess and adjacent said spacers; and
   an isolation material positioned in said first and second recess, said isolation material being positioned adjacent said isolation liner.

* * * * *